United States Patent
Hiramatsu et al.

(10) Patent No.: US 6,503,610 B2
(45) Date of Patent: Jan. 7, 2003

(54) GROUP III-V COMPOUND SEMICONDUCTOR AND METHOD OF PRODUCING THE SAME

(75) Inventors: Kazumasa Hiramatsu, Yokkaichi (JP); Hideto Miyake, Hisai (JP); Takayoshi Maeda, Nabari (JP); Yasushi Iyechika, Tsukuba (JP)

(73) Assignee: Sumitomo Chemical Company, Limited, Osaka (JP)

( * ) Notice: Subject to any disclaimer, the term of this patent is extended or adjusted under 35 U.S.C. 154(b) by 32 days.

(21) Appl. No.: 09/814,875

(22) Filed: Mar. 23, 2001

(65) Prior Publication Data

US 2001/0031385 A1 Oct. 18, 2001

(30) Foreign Application Priority Data

Mar. 24, 2000 (JP) ........................................ 2000-083956
Sep. 22, 2000 (JP) ........................................ 2000-288259

(51) Int. Cl.[7] .............................. C30B 1/00; B32B 9/00
(52) U.S. Cl. .................... 428/210; 428/689; 428/697; 428/698; 438/478; 438/481; 117/104; 117/105; 117/108
(58) Field of Search .............................. 428/210, 689, 428/697, 698; 423/406; 117/89, 104, 105, 108; 438/604, 478, 481

(56) References Cited

U.S. PATENT DOCUMENTS 6,051,849 A 4/2000 Davis et al. ................. 257/103
6,368,733 B1 * 4/2002 Nishinaga .................... 428/698
6,380,051 B1 * 4/2002 Yuasa et al. ................. 438/481

FOREIGN PATENT DOCUMENTS

| EP | 0874405 A2 | 10/1998 |
| EP | 0982819 A1 | 3/2000 |
| JP | 10312971 A | 11/1998 |
| JP | 11135770 A | 5/1999 |

OTHER PUBLICATIONS

Sasaoka et al., *J. Jpn. Association Crystal Growth*, vol. 25, No. 2, pp. 21–27 (1998). (No Month).

Beaumont et al., *Phys. Stat. Sol (a)*, vol. 176, pp. 567–571 (1999). (No Month).

Usui et al., *Jpn. J. Appl. Phys.*, vol. 36, pp. L899–L902, Jul. 1997.

Nakamura et al., *Jpn. J. Appl. Phys.*, vol. 36, pp. L1568–L1571 Dec. 1997.

* cited by examiner

*Primary Examiner*—Deborah Jones
*Assistant Examiner*—Stephen Stein
(74) *Attorney, Agent, or Firm*—Birch, Stewart, Kolasch & Birch, LLP

(57) ABSTRACT

Provided is a method of producing a group III–V compound semiconductor having a low dislocation density without increasing the thickness of a re-grown layer, the method includes a re-growing process using a mask pattern, and threading dislocations in the re-grown layer are terminated by the voids formed on the pattern.

7 Claims, 3 Drawing Sheets

GROUP III–V COMPOUND SEMICONDUCTOR AND METHOD OF PRODUCING THE SAME

BACKGROUND OF THE INVENTION

1. Field of the Invention

The present invention relates to a group III–V compound semiconductor represented by the general formula InGaAlN and a method for producing the same.

2. Description of the Related Art

A group III–V compound semiconductor represented by the general formula $In_xGa_yAl_zN$, where $x+y+z=1$, $0 \leq x \leq 1$, $0 \leq y \leq 1$, and $0 \leq z \leq 1$ can be utilized as a material for highly efficient light-emitting device ranging from an ultraviolet to visible ray region because they allow direct band gap energy to be adjusted to optical energy having a wavelength in a region ranging from ultraviolet to red by changing the composition of the group III elements. Further, such a group III–V compound semiconductor has a larger band gap than conventionally-used typical semiconductors such as Si and GaAs and, hence, keeps its semiconductor properties even at such an elevated temperature at which the conventional semiconductors cannot operate. For this reason, the group III–V compound semiconductors principally allow the fabrication of electronic devices having superior environmental resistances.

Such a compound semiconductor is difficult to grow into a large crystal because of its very high vapor pressure at around its melting point. For this reason, there has so far not been obtained a large crystal of such a compound semiconductor for practical use as a substrate to be used in the fabrication of a semiconductor device. Thus, a compound semiconductor of this type, in general, is produced by allowing the compound semiconductor to epitaxially grow on a substrate of a material, such as sapphire or SiC, that is similar in crystal structure to the compound semiconductor and capable of providing a large crystal. At present, a relatively high-quality crystal of the compound semiconductor can be obtained by this method. Even in this case, it is difficult to reduce crystalline defects resulting from the difference in lattice constants or expansion coefficients between the substrate material and the compound semiconductor and the resulting compound semiconductor generally has a defect density of about $10^8$ $cm^{-2}$ or more.

A technique was reported of obtaining such a group III–V compound semiconductor having a reduced defect density from a compound semiconductor having a high density of crystalline defects (Jpn. J. Appl. Phys., vol. 36, p. L899, 1997). According to this report, the aforesaid compound semiconductor having a high defect density (hereinafter may be referred to as "underlying crystal") is covered with an $SiO_2$ pattern while fine openings are left uncovered, and a crystal growth on this structure is performed again (such a second or subsequent crystal growth may hereinafter be referred to as "re-growth").

In the initial stage of re-growth, what is called "selective growth" occurs such that crystal growth does not occur on the pattern but only through the openings. As the growth continues further from this stage, crystal grown through the openings begins to extend over the pattern, and after a while, results to form a structure in which the pattern is buried. Immediately after the pattern has been buried, the crystal grown in the re-growth process has an uneven surface. However, the unevenness of the surface of the crystal is reduced as the crystal growth proceeds further, and finally, a crystal having a flat surface can be obtained.

Such a buried structure is confirmed to have a significantly lowered dislocation density in the re-grown layer. However, mechanisms of reducing defects differ depending upon the growing technique or growing conditions. Such mechanisms can be roughly divided into the following two sorts. The first mechanism is such that the re-grown layer takes over threading dislocations from the underlying substrate but the pattern terminates such threading dislocations thereunder and, hence, portions of the re-grown layer on the pattern have no dislocation, as shown in FIG. 1. In this case, however, dislocations can be reduced only in the portions of the re-grown layer lying on the pattern and reduction of dislocations can hardly be expected in portions of the re-grown layer that lying above the openings because such portions take over dislocations from the underlayer.

The second mechanism is such that portions of the re-grown layer above the openings grow with forming facets and the direction of each threading dislocation taken over from the underlayer are bent into the growing plane by the facets with the result that the defect density is reduced as the thickness of the growing layer increases, as shown in FIG. 2. Contrary to the structure resulting from the first mechanism, the structure in this case has dislocations concentrated in portions on the pattern but a lowered dislocation density in portions above the openings. To reduce these dislocations sufficiently, the re-grown layer is required to grow to a thickness as thick as several ten $\mu$m or more. Such a thick film causes a resulting substrate to bow to such an extent that cannot be negligible. This causes sometimes problems that temperature distribution along the substrate plane becomes large when further growth is carried out on the substrate, and that a later device fabrication process cannot be achieved with a desired precision because of the unevenness of the substrate.

An object of the present invention is to provide a method of producing a group III–V compound semiconductor having a low dislocation density without increasing the thickness of a re-grown layer, the method including a re-growing process using a mask pattern, and to provide such a group III–V compound semiconductor having a low dislocation density.

As a result of extensive studies in view of the above situations, the present inventors have found that the above problems can be avoided by employing a re-growing process which provides a specified structure between the pattern and the crystal grown on the pattern.

SUMMARY OF THE INVENTION

That is, the present invention is directed to item (1): a group III–V compound semiconductor comprising: a layer of a first group III–V compound semiconductor represented by the general formula $In_uGa_vAl_wN$, where $0 \leq u \leq 1$, $0 \leq v \leq 1$, $0 \leq w \leq 1$, and $u+v+w=1$; a pattern formed on the layer of the first group III–V compound semiconductor and made of a material different from the first group III–V compound semiconductor and from a second group III–V compound semiconductor below; and a layer of the second group III–V compound semiconductor represented by the general formula $In_xGa_yAl_zN$ where $0 \leq x \leq 1$, $0 \leq y \leq 1$, $0 \leq z \leq 1$, and $x+y+z=1$, said layer is grown through the openings of the pattern; wherein voids are formed on the pattern, and threading dislocations in the layer of the second compound semiconductor are terminated by the voids.

The present invention is also directed to item (2): a method of producing a group III–V compound semiconductor recited in item (1), comprising a process for forming a layer of the second group III–V compound semiconductor, the process includes: a first step of growing the layer of the second group III–V compound semiconductor through the openings of the pattern until surface portion thereof parallel to the surface of the layer of the first group III–V compound semiconductor disappears; and a second step of continuing the growth of the layer of the second group III–V compound semiconductor with changing the growing condition so as to allow to have surfaces parallel to the surface of the layer of the first group III–V compound semiconductor, thereby forming voids on the pattern.

The present invention is also directed to item (3): a method of producing a group III–V compound semiconductor recited in item (1), comprising a process for forming a layer of the second group III–V compound semiconductor, the process including: a first step of growing the layer of the second group III–V compound semiconductor through the openings of the pattern until surface portion thereof parallel to the surface of the layer of the first group III–V compound semiconductor disappears; and a second step of continuing the growth of the layer of the second group III–V compound semiconductor with changing the growth condition so as to allow the layer to have surfaces of (0001) plane and facets perpendicular to the (0001) plane, thereby forming voids on the pattern.

The present invention is also directed to item (4): a method of producing a group III–V compound semiconductor recited in item (1), comprising a process for forming a layer of the second group III–V compound semiconductor, the process includes: a first step of growing the layer of the second group III–V compound semiconductor through the openings of the pattern until surface portion thereof parallel to the surface of the layer of the first group III–V compound semiconductor disappears; a second step of continuing the growth of the layer of the second group III–V compound semiconductor so as to have slanted facets only; and a third step of continuing the growth of the layer with changing the growth condition so as to allow the layer of the second group III–V compound semiconductor to have surfaces parallel to the surface of the layer of the first group III–V compound semiconductor, thereby forming voids on the pattern.

The present invention is also directed to item (5): a method of producing a group III–V compound semiconductor recited in item (1), comprising a process for forming a layer of a second group III–V compound semiconductor, the process includes: a first step of growing the layer of the second group III–V compound semiconductor through the openings of the pattern until a surface portion thereof parallel to the surface of the layer of the first group III–V compound semiconductor disappears; a second step of continuing the growth of the layer of the second group III–V compound semiconductor so as to have slanted facets only; and a third step of continuing the growth of the layer with changing the growth condition so as to allow the layer of the second group III–V compound semiconductor to have surfaces of (0001) plane and facets perpendicular to the (0001) plane, thereby forming voids on the pattern.

The present invention is still also directed to item (6): a group III–V compound semiconductor obtained by performing at least once a process including forming a pattern and re-growing a group III–V compound semiconductor on a layer of the group III–V compound semiconductor of item (1).

Figure 1:
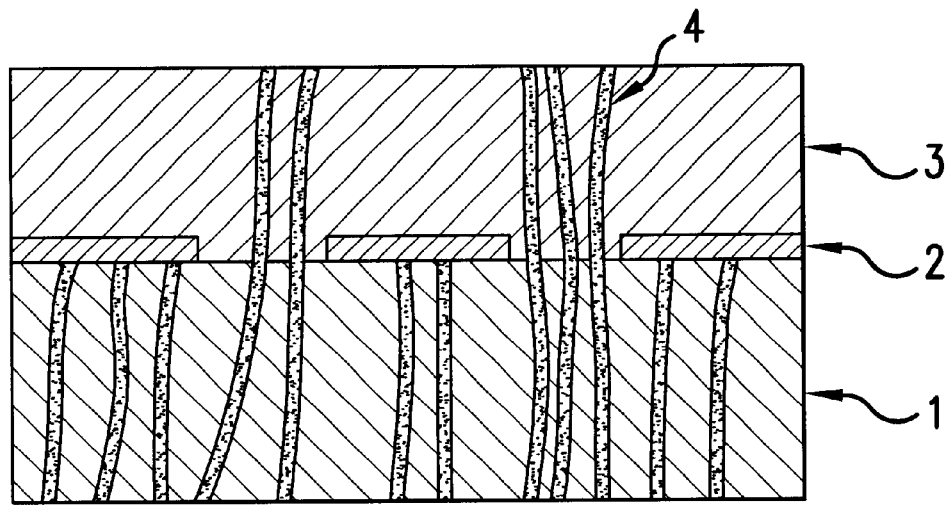
FIG. 1 is a view illustrating a state where threading dislocations are terminated by a mask pattern.
Figure 2:
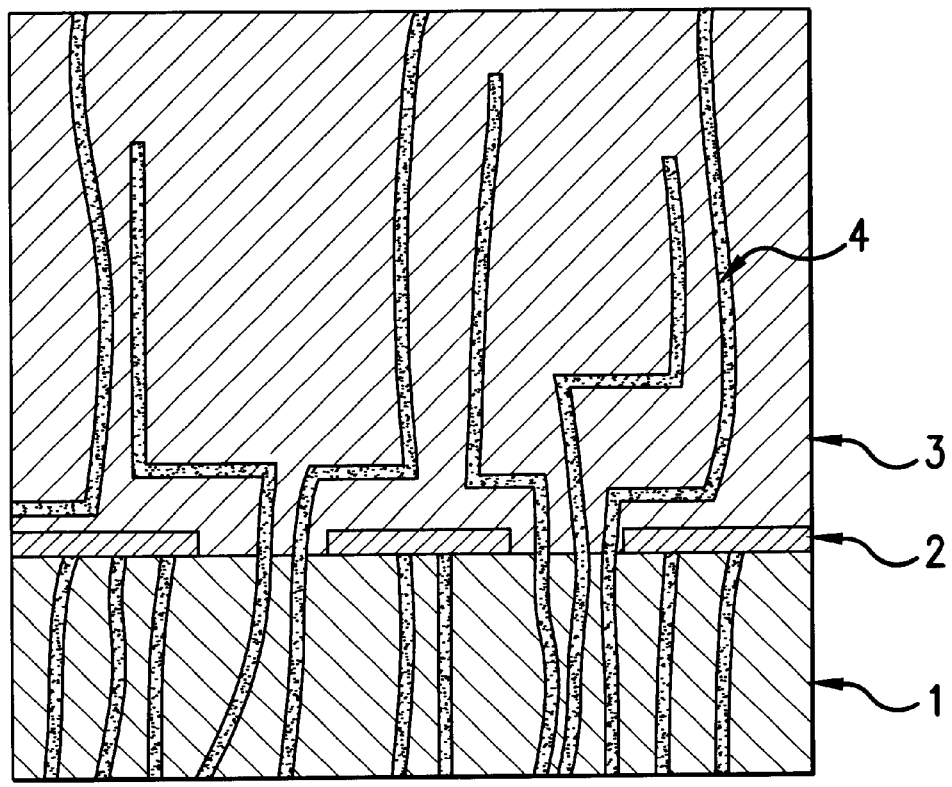
FIG. 2 is a view illustrating a state where the direction of dislocation is bent.

1 . . . layer of the first group III–V compound semiconductor (underlying crystal)
2 . . . pattern formed of a material different from the first group III–V compound semiconductor and from the second compound semiconductor
3 . . . layer of the second group III–V compound semiconductor (re-grown layer)
4 . . . threading dislocation
5 . . . void on the mask pattern
6 . . . n-GaN
7 . . . n-AlGaN cladding layer
8 . . . InGaN/GaN quantum well active layer
9 . . . p-AlGaN cladding layer
10 . . . insulating layer
11 . . . p-GaN
12 . . . n-electrode
13 . . . p-electrode

DETAILED DESCRIPTION OF THE INVENTION

Figure 3:
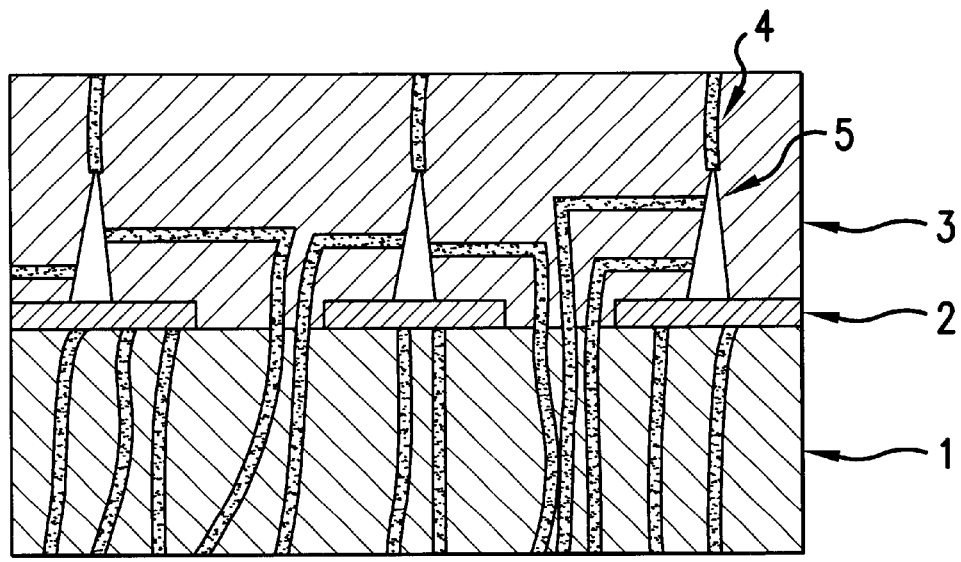
FIG. 3 is a view illustrating state where dislocations are reduced.

The group III–V compound semiconductor according to the present invention is characterized that portions growing through opening portions of the pattern on the underlying crystal have dislocations taken over from the underlying crystal which become generally bent into the growing plane and that these dislocations thus bent are terminated by voids formed on the pattern whereby propagation of such dislocations into the re-growing crystal is stopped, as shown in FIG. 3.

Processes for crystal growth used for the re-growth according to the present invention include Molecular Beam Epitaxy (MBE), Hydride Vapor Phase Epitaxy (HVPE), and Metal Organic Vapor Phase Epitaxy (MOVPE). The MBE process can be suitably used in the present invention because the process is capable of forming a steep interface with high controllability. The HVPE process can be suitably used in the invention because the process ensures a high growth rate thereby to provide crystal of good quality in a short time. The MOVPE process can also be suitably used because the process allows crystal growth on multiple substrates with high uniformity.

The following raw materials can be used in the production of the group III–V compound semiconductor by the HVPE process.

Group III raw materials may be prepared by allowing hydrogen chloride gas to react with metallic gallium, metallic indium or the like to produce GaCl or InCl. Alternatively, group III raw materials may be prepared by allowing hydrogen chloride gas to react with trialkyl gallium represented by the general formula $R_1R_2R_3Ga$ (where $R_1$, $R_2$, and $R_3$ are each a lower alkyl group) such as TMG or TEG, trialkyl indium represented by the general formula $R_1R_2R_3In$ (where $R_1$ $R_2$, and $R_3$ are each a lower alkyl group) such as TMI or triethyl indium, or the like at an elevated temperature to produce GaCl, InCl or the like. Further alternatively, dimethyl gallium chloride ($Ga(CH_3)_2Cl$), diethyl gallium chloride ($Ga(C_2H_5)_2Cl$), dimethyl indium chloride ($In(CH_3)_2Cl$), diethyl indium chloride ($In(C_2H_5)_2Cl$), or the like is decomposed at an elevated temperature to produce GaCl, InCl or the like. $GaCl_3$, $InCl_3$ or the like, which is stable at a normal temperature, may be bubbled with a carrier gas and supplied. These may be used either alone or as a mixture.

The following raw materials can be used in the production of the group III–V compound semiconductor based on the MOVPE process.

Examples of group III raw materials include trialkyl gallium represented by the general formula: $R_1R_2R_3Ga$ (where $R_1$, $R_2$, and $R_3$ are each a lower alkyl group) such as trimethyl gallium [$(CH_3)_3Ga$, hereinafter referred to as "TMG" as the case may be] and triethyl gallium [$(C_2H_5)_3Ga$, hereinafter referred to as "TEG" as the case may be]; trialkyl aluminum represented by the general formula: $R_1R_2R_3Al$ (where $R_1$, $R_2$, and $R_3$ are each a lower alkyl group) such as trimethyl aluminum [$(CH_3)_3Al$]; triethyl aluminum [$(C_2H_5)_3Al$, hereinafter referred to as "TEA" as the case may be], and triisobutyl alluminum [$(i-C_4H_9)_3Al$]; trimethylamine alane [$(CH_3)_3N{:}AlH_3$]; and trialkyl indium represented by the general formula: $R_1R_2R_3In$ (where $R_1$, $R_2$, and $R_3$ are each a lower alkyl group) such as trimethyl indium [$(CH_3)_3In$, hereinafter referred to as "TMI" as the case may be] and triethyl indium [$(C_2H_5)_3In$]. These may be used either alone or as a mixture.

In the HVPE process and the MOVPE process, examples of group V raw materials include ammonia, hydrazine, methylhydrazine, 1,1-dimethylhydrazine, 1,2-dimethylhydrazine, t-butylamine, and ethylenediamine. These may be used either alone or as a mixture. Among these raw materials, ammonia and hydrazine have an advantage that a resulting compound semiconductor is less contaminated by carbon because they do not contain any carbon atom in their molecules. Ammonia is preferred in terms of easier handling.

In the HVPE process and the MOVPE process may be used a diluent gas such as hydrogen, nitrogen or helium as a carrier gas for the raw materials.

Factors in controlling a facet in the re-growth process which is important in the present invention are the amount of each raw material to be supplied, growth temperature, growth pressure, carrier gas, impurities, and the like. Sometimes it is effective in controlling a facet in the re-growth process by adding materials which can not be incorporated at a large amount. Examples of the materials are In containing materials, such as tri-methyl-indium, when a growth condition suppressing In incorporation (high temperature, low pressure, hydrogen as the carrier gas, etc) is used.

According to the present invention, the first step of the re-growth process is performed under conditions suitable for bending the direction of each dislocation taken over from the underlying crystal to extend along the interface between the underlying crystal and the re-growing layer. Specifically, the re-growth is performed until surface portion thereof parallel to the surface of the underlying crystal disappears. Usually the surface extending parallel to the surface of the underlying crystal is (0001) plane. Under such growth conditions, facets slanted with respect to the underlying crystal result. Even after the surface of the re-growing crystal parallel to the surface of the underlying crystal has disappeared, the re-growth may be continued under the same conditions with slanted facets only.

Such slanted facets are likely to result in the following cases: the growth temperature is low; the ratio of the supplied amount of a group III raw material to that of a group V raw material is high; the width of each opening portion of the pattern is smaller than the width of each pattern portion of the pattern; the growth pressure is high; and hydrogen is used as a carrier gas.

In the second step according to the present invention, voids are intentionally formed on the pattern to terminate dislocations at interfaces between the voids and the re-growing crystal for the purpose of preventing the dislocations each extending in a direction once bent from propagating into the surface of the re-growing crystal. Specifically, the re-growth is continued under the growth conditions changed so as to allow the layer of the second group III–V compound semiconductor to have a plane parallel to the surface of the layer of the first group III–V compound semiconductor. The conditions for providing a plane parallel to the surface of the layer of the first group III–V compound semiconductor are generally reverse to the conditions for providing a slanted facet. In addition, such a parallel plane is likely to result when nitrogen is used as a carrier gas or when an Mg raw material is supplied as impurities. By continuing the re-growth under such conditions voids are formed on the pattern.

Figure 4:
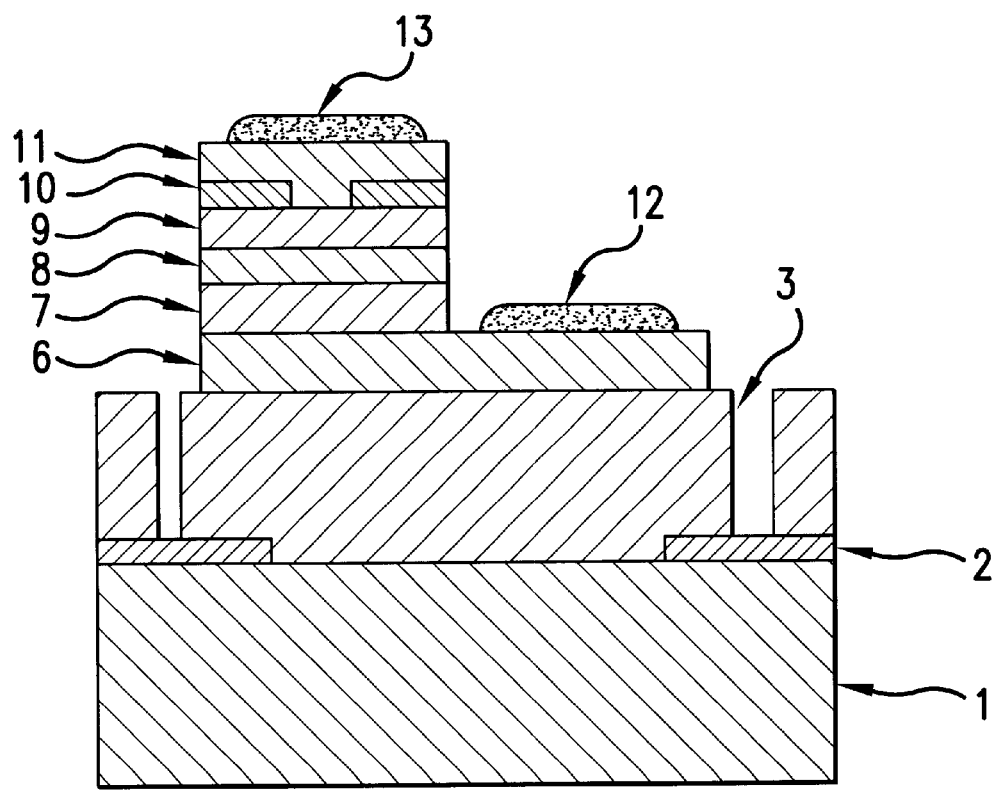
FIG. 4 is a schematic view illustrating a semiconductor laser device fabricated on a compound semiconductor having remaining opening portions defined by voids.
Figure 5:
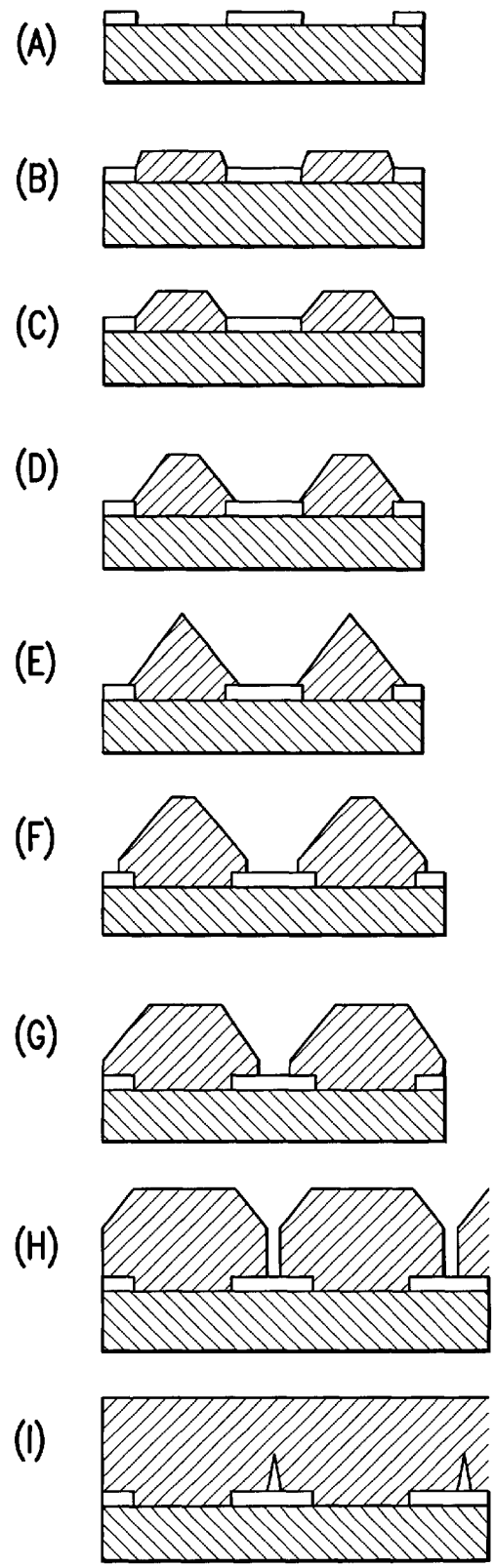
FIG. 5, views (a) to (i), illustrate a re-growth step of the present invention. Views (a) to (e) illustrate the initial stage of growing a layer of the second group III–V compound semiconductor through the openings of a pattern. The view (e) illustrates a state where the surface portion parallel to the surface of the layer of the first group III–V compound semiconductor disappears. Views (f) to (i) illustrate the following stage of growing a layer of the second group III–V compound semiconductor to have surfaces parallel to the surface of the layer of the first group III–V compound semiconductor, and forming voids on the pattern.

FIG. 3 illustrates a case where the width of each void becomes narrower as the re-growth proceeds and finally the re-growing surface becomes flattened. However, when a device to be fabricated on the compound semiconductor of the present invention has an area equal to or smaller than the area of the pattern, the surface of the re-grown crystal may have exposed openings defined by the voids. A typical semiconductor laser, for example, has an active layer having a width of about 3 μm and a length of about 1 mm or smaller. Such a laser device can be fabricated on the compound semiconductor while avoiding the openings defined by the voids if a stripe mask is used having a mask interval of about 5 μm or more and a length of 1 mm or more. FIG. 4 schematically illustrates this case.

When the mask pattern is of a stripe form, the stripes thereof preferably extend in <1–100> direction rather than <11–20> direction because the stripes extending in <1–100> direction allow a slanted facet to turn into a plane parallel to the surface of the underlying crystal with higher controllability. When such a mask pattern having stripes extending in <1–100> direction is used, the slanted facet resulting in the first step is in {11–22} plane and the second step is likely to provide (0001) plane and a facet in {11–20} plane.

Such a crystal having a lower defect density thus produced is likely to have a few dislocations above the mask pattern. In such a case the number of defects above a pattern can be reduced by forming a mask pattern again on the surface of the re-grown crystal and performing the re-growth further.

The pattern used in the second re-growth should be formed so that the pattern covers the region where the dislocations after the first re-growth exist. After the first re-growth, the dislocations exist only in limited area i.e. above the nearly center of the pattern of the first re-growth. Therefore, the pattern used in the second re-growth can be comparably smaller than the pattern used in the first re-growth. Using a smaller pattern for the second re-growth, the pattern is buried in a comparably smaller thickness. This means reduction of stress, fluctuation of the crystal axes of the second regrown layer, and reduction of bending of the wafer after the re-growth, and is preferable.

Though specific conditions may vary depending on the apparatus used for crystal growth, one skilled in the art would make it possible to adequately perform the growth of the compound semiconductor by previously examining the dependency of a resulting facet upon the growth conditions.

Since a crystal having a lowered defect density over a large area can be obtained according to the present invention, an additional characteristic of the present invention is that a light-emitting device having improved light-emitting properties and reliability can be fabricated on such a crystal. Also, such a crystal allows the fabrication of a light-receiving device with a dark current satisfactory suppressed by virtue of its lowered defect density. Further, such a crystal allows the fabrication of an electronic device having improved properties by virtue of its reduced defects.

In the present invention, certain conditions for forming the pattern or certain re-growth conditions may cause the surface of the layer of the first group III–V compound semiconductor to be formed with dents after the re-growth. The occurrence of such dents may be inhibited by using a group III–V compound semiconductor represented by the general formula: $In_uGa_vAl_wN$, where $0 \leq u \leq 1$, $0 \leq v \leq 1$, $0 \leq w \leq 1$, and u+v+w=1 for the layer of the first group III–V compound semiconductor. Specifically, the mixed crystal rate of AlN (corresponding to the value w in the above general formula) is 1% or more, preferably 5% or more. The specific thickness of the layer of the first group III–V compound semiconductor is 0.3 nm or more, preferably 1 nm or more.

A preferable material for the pattern according to the present invention has a certain degree of durability in the re-growth of the compound semiconductor. This is because it is difficult for the intended re-growth to be achieved with a good reproducibility if the pattern is formed of such a material as to cause the pattern to be lost by evaporation or to be deformed by fusion in the re-growth atmosphere and at the re-growth temperature before the re-growth of crystal starts on a sample formed with the pattern. Examples of materials usable under such conditions include $SiO_2$ (silicon oxide); elementary substances such as W, Re, Mo, Cr, Co, Si, Au, Zr, Ta, Ti, Nb, Ni, Pt, V, Hf, and Pd; BN (boron nitride); nitrides of W, Ti, Zr, Hf, V, Nb, Ta, Cr, Mo, Re, Fe, Si; and the like.

In the present invention, the pattern may comprise at least two layers of different materials.

In the present invention, the pattern may be of any known form. Examples of specific forms include what is generally called "line/space" which has stripes having equal widths are aligned parallel to each other with opening portions having equal widths each intervening between each pair of adjacent stripes, and a form for partially exposing the underlayer circularly or polygonally. Any one of these pattern forms may be selected to accommodate the re-growth conditions, the material of the pattern, or the like.

In the case of a pattern of the line/space form, the width of each pattern portion is preferably not less than 0.05 μm and not more than 20 μm. If the width of each pattern portion is less than 0.05 μm, the effect of reducing defect density, which is an advantage of the invention, does not become noticeable. If the width is more than 20 μm, time required to bury the pattern becomes too long in terms of practicality. In the case of a pattern having circular or polygonal opening portions, similarly, the distance between adjacent opening portions is preferably not less than 0.05 μm and not more than 20 μm for the same reason as stated above.

Each space portion (opening portion exposing the underlayer) of the line/space pattern preferably has a width of not less than 0.01 μm and not more than 20 μm. If the width of each space portion is less than 0.01 μm, the semiconductor processing technique at present has a difficulty in forming a practically precise configuration and, hence, such a narrow space is not preferable. If the width is more than 20 μm, the effect of reducing the defect density becomes unnoticeable. In the case of a pattern having circular or polygonal opening portions, similarly, the distance between adjacent opening portions is preferably not less than 0.01 μm and not more than 20 μm for the same reason as stated above.

The pattern can be formed by any known process such as vapor deposition, sputtering, chemical vapor deposition (CVD), and plating. Alternatively, a process may be employed such that a thin film of an elementary substance is formed and then the film is subjected to a chemical reaction to turn the elementary substance into a compound. More specifically, it is possible to employ, for example, a process such as to form a thin film of tungsten and then heat-treat the film in an ammonia-containing atmosphere to turn tungsten into tungsten nitride. The thickness of the pattern can be determined in view of practical durability and productivity. In the case of tungsten, the thickness is preferably not less than 2 nm and not more than 5 μm.

Other specific growth conditions are as follows. In the case where the compound semiconductor to be grown does not contain In as an essential element, the growth temperature is preferably not lower than 600° C. and not higher than 1200° C. When the re-growth temperature is lower than 600° C. or higher than 1200° C., a crystal of good quality is difficult to obtain by the re-growth. In the case where the compound semiconductor to be grown contains In as an essential element, the re-growth temperature is preferably not lower than 600° C. and not higher than 900° C. because such a compound semiconductor has a lower heat stability.

The growth pressure for the re-growth in the present invention is not lower than 100 Pa. If the growth pressure in the re-growth process is lower than 100 Pa, a crystal of satisfactory quality is difficult to obtain. The growth pressure is preferably not lower than 500 Pa, more preferably not lower than 1000 Pa. It should be noted that though the crystallinity is improved as the growth pressure rises, the growth pressure for the re-growth is preferably not higher than 10 atm because an MOVPE or HVPE apparatus generally used in crystal growth does not use a very high growth pressure from the industrial point of view.

Any known method can be adopted to evaluate defects. Examples of such methods include: observation of images of dislocations on a crystal surface by means of an atomic force microscope (hereinafter may be referred to as "AFM"); evaluation of an etch pit density (hereinafter may be referred to as "EPD") with use of a molten alkali or a phosphoric acid etchant; evaluation of anomalous growth points (hereinafter may be referred to as "growth pit(s)") which appear when a material having lattice mismatch with an underlying crystal, like InGaN relative to GaN, is grown on the surface of the underlying crystal; and observation of images of dislocations by means of a transmission electron microscope (hereinafter referred to as "TEM" as the case may be).

The method of the reduction of dislocations of the present invention can be used in combination with other known methods for the reduction of dislocations. Examples of the methods for the reduction of dislocations are as follows: a method utilizing a low-temperature grown interlayer (Jpn. J. Appl. Phys., 1999, vol. 38, L1515), a method forming a gap between the underlayer and the re-grown layer by re-growth (it may be called "air gap method", hereafter. J. Cryst. Growth, 2000, vol. 221, 338), a method forming a regrown layer on a partly etched crystal surface of the underlayer (it may be called "grooved stripe method", hereafter. J. Cryst. Growth, 2000, vol. 221, 345), a method forming a re-grown layer on side walls of partly etched crystal surface of the underlayer (it may be called "pendeo-epitaxy method", hereafter. MRS Internet Journal, Nitride Semicond. Res., 1999, vol. 4S1, G3.38), a method flattening of partly etched crystal surface of the underlayer by annealing at a high temperature (it may be called "mass transport method", hereafter. MRS Internet Journal, Nitride Semicond. Res., 2000, vol. 5S1, W2.8), and a method of the re-growth on a small impurities deposited surface of the underlayer (it may be called "anti-surfactant method", hereafter. Jpn. J. Appl. Phys., 2000, vol. 39, L831). Among these methods, the method utilizing a low-temperature grown interlayer, the grooved stripe method, the mass transport method, and the anti-surfactant method can be used preferably.

Using the present invention, or the present invention in combination with other methods, the compound semiconductor of extremely dislocation reduced can be achieved in comparably small thickness. As a result, bending of the substrate can be reduced, and it is quite effective in improving the process performance of device producing process.

EXAMPLES

The following examples further illustrate the present invention specifically but are not to be construed to limit the scope thereof.

Example 1

First, an underlying crystal was prepared in the following manner. On a sapphire substrate was grown a GaN buffer layer to a thickness of 50 nm at 550° C. by MOVPE, and further, GaN was grown to a thickness of 4 μm at about 1100° C. On this underlying crystal was formed a 80 nm-thick SiO$_2$ film by sputtering, which in turn was patterned into a stripe pattern having 5 μm-wide opening portions and 5 μm-wide pattern portions extending in <1–100> direction by typical photolithography.

Subsequently, GaN was re-grown on this underlying crystal by MOVPE. As a first re-growth tier, GaN was grown at 66.7 kPa (500 Torr) and 950° C. for 45 min, while trimethyl gallium (hereinafter may be referred to as "TMG") and ammonia as raw materials were supplied at a rate of 45 μmol/min and in an amount of 1 slm, respectively, with use of hydrogen as a carrier gas. Under these conditions, a plane parallel to the surface of the GaN underlayer disappears, while only slanted facets grow. Accordingly, the resulting re-grown crystal had a triangular facet in section.

As a second re-growth tier, GaN was further grown for 105 min at 1050° C., which is a temperature condition allowing the horizontal growth to be facilitated for providing a flat surface. The total thickness of the re-grown layer comprising the first and second tiers was about 10 μm. The surface of the crystal thus obtained was flat. A section of the crystal was observed to have a void extending in the re-grown crystal from the center of each pattern portion by means of a scanning electron microscope (hereinafter may be referred to as "SEM").

The surface of this crystal was observed to have pits corresponding to dislocations only at a location above the center of each pattern portion by means of AFM, and the average pit density was about $10^6$ cm$^{-2}$. When InGaN was grown to a thickness of 500 nm on a similar crystal at 800° C. by supplying ammonia, TMG and trimethyl indium (hereinafter may be referred to as "TMI") with use of nitrogen as a carrier gas, the resulting crystal had growth pits only at a location above the center of each pattern portion. The pit density of other portions of the crystal was $10^6$ cm$^{-2}$, and the pit density of the whole crystal including the portion at the location above the center of each pattern was $10^7$ cm$^{-2}$.

Further reduction of dislocations is achieved by applying other dislocation-reduction methods to the samples obtained in the Example. For example, growth of a low temperature interlayer of GaAlN and a high temperature GaN layer on the sample of the Example, is used for the further reduction of dislocations existing after the first re-growth. For another example, the mass-transport method is used for the further reduction of dislocations. That is, the surface portion of the re-grown layer above the pattern where dislocations mainly exist, is etched to make steps, and then annealed to make the surface smooth. Also the anti-surfactant method is used for the further reduction of dislocations. That is, small particles of impurity like Si are formed on the surface of the regrown layer, and then GaN is grown.

Comparative Example 1

InGaN was grown directly on an underlying crystal as used in Example 1. The resulting InGaN layer was observed to have a growth pit density of $4 \times 10^8$ cm$^{-2}$.

Example 2

In the same manner as in Example 1, a stripe pattern having 3 μm-wide opening portions and 7 μm-wide stripe portions was formed, and re-growth was performed for 30 min to obtain a first re-growth tier. Under these conditions, a plane parallel to the surface of the GaN underlayer disappears and only slanted facets grow. Accordingly, the resulting re-grown crystal had a triangular facet in section. Subsequently, re-growth was performed for 90 min to form a second re-growth tier. Further, InGaN was grown to a thickness of 500 nm for the purpose of observing growth pits. A section of this sample was observed to have a void immediately on the center of each pattern portion by means of SEM. Though a series of growth pits were observed at a portion above this void, portions other than the portion having the series of growth pits and its periphery had a pit density as low as about $3 \times 10^7$ cm$^{-2}$.

By forming another pattern on the crystal obtained in this example at a location just above the first-formed pattern, i.e., in a portion having a higher density of dislocations and performing further re-growth, dislocations immediately above each pattern portion of the second pattern can be reduced.

Comparative Example 2

A stripe pattern having 3 μm-wide opening portions and 3 μm-wide stripe portions was formed, and re-growth was performed in the same manner as in Example 2 except that the first re-growth tier was formed at 10.7 kPa (80 Torr) and 1000° C. Under these growth conditions, the resulting re-grown crystal has facets substantially perpendicular to the underlying crystal and, hence, the direction of each threading dislocation taken over from the underlying crystal does not vary. Growth pits were observed above each pattern portion and each opening portion both. The pit density was $10^8$ cm$^{-2}$.

Comparative Example 3

A sample was prepared in the same manner as in Example 2 except that a stripe pattern having 2 μm-wide opening portions and 2 μm-wide stripe portions was formed. A section of this sample was observed to have no void above the center of each pattern portion by means of SEM. A number of pits were found above the pattern portions, and the density of pits was $10^8$ cm$^{-2}$.

Example 3

A buried structure was prepared in the same manner as in Example 1 except that a stripe pattern having 3 μm-wide opening portions and 3 μm-wide stripe portions was formed. The growth pit density of the resulting structure was $1 \times 10^7$ cm$^{-2}$ according to evaluation.

Example 4

In the first re-growth step, a stripe pattern of SiO$_2$ having 5 μm-wide opening portions and 5 μm-wide stripe portions extending in <1–100> direction was formed on a GaN underlayer in the same manner as in Example 1, and a first re-growth tier was grown thereon at 66.7 kPa (500 Torr) and 950° C. Under these conditions, a plane parallel to the surface of the GaN underlayer disappears, while only slanted facets grow. Accordingly, the resulting re-grown crystal had a triangular facet in section. Subsequently, a second re-growth tier was grown at 1050° C. The total thickness of the re-grown layer comprising the first and second tiers was about 5 μm. The re-growth of the second step was performed in the same manner as the re-growth of the first step except that the direction of the stripe was inclined 60° with respect to that of the stripe formed for the first re-growth step. When InGaN was grown after the re-growth of the second step, the resulting crystal was evaluated to have a growth pit density of $1 \times 10^6$ to $1 \times 10^7$ cm$^{-2}$.

Example 5

In the first re-growth step, a stripe pattern of SiO$_2$ having 5 μm-wide opening portions and 5 μm-wide stripe portions extending in <1–100> direction was formed on a GaN underlayer in the same manner as in Example 1, and a first re-growth tier was grown thereon at 66.7 kPa (500 Torr) and 950° C. Under these conditions, a plane parallel to the surface of the GaN underlayer disappears, while only slanted facets grow. Accordingly, the resulting re-grown crystal had a triangular facet in section. Subsequently, a second re-growth tier was grown at 1050° C. In this Example, a stripe pattern was further formed after the first step of re-growth as superposed just above the mask of the first step, and then the second re-growth step of GaN was carried out at 40.0 kPa (300 Torr) and 1050° C. Subsequently InGaN was grown after the re-growth of the second step, and the resulting crystal was evaluated to have a growth pit density of $1 \times 10^4$ to $1 \times 10^6$ cm$^{-2}$.

The method of producing a group III–V compound semiconductor according to the present invention makes it possible to obtain a group III–V compound semiconductor of higher quality having reduced threading dislocations.

What is claimed is:

1. A group III–V compound semiconductor comprising: a layer of a first group III–V compound semiconductor represented by the general formula In$_u$Ga$_v$Al$_w$N, where $0 \leq u \leq 1$, $0 \leq v \leq 1$, $0 \leq w \leq 1$, and u+v+w=1; a pattern formed on the layer of the first group III–V compound semiconductor and made of a material different from the first group III–V compound semiconductor and from a second group III–V compound semiconductor below; and a layer of the second group III–V compound semiconductor represented by the general formula In$_x$Ga$_y$Al$_z$N where $0 \leq x \leq 1$, $0 \leq y \leq 1$, $0 \leq z \leq 1$, and x+y+z=1, said layer is grown through the openings of the pattern; wherein voids are formed on the pattern, and threading dislocations in the layer of the second compound semiconductor are terminated by the voids.

2. A method of producing a group III–V compound semiconductor in claim 1, comprising a process for forming a layer of the second group III–V compound semiconductor, the process includes: a first step of growing the layer of the second group III–V compound semiconductor through the openings of the pattern until surface portion thereof parallel to the surface of the layer of the first group III–V compound semiconductor disappears; and a second step of continuing the growth of the layer of the second group III–V compound semiconductor with changing the growing condition so as to allow to have surfaces parallel to the surface of the layer of the first group III–V compound semiconductor, thereby forming voids on the pattern.

3. A method of producing a group III–V compound semiconductor in claim 1, comprising a process for forming a layer of the second group III–V compound semiconductor, the process including: a first step of growing the layer of the second group III–V compound semiconductor through the openings of the pattern until surface portion thereof parallel to the surface of the layer of the first group III–V compound semiconductor disappears; and a second step of continuing the growth of the layer of the second group III–V compound semiconductor with changing the growth condition so as to allow the layer to have surfaces of (0001) plane and facets perpendicular to the (0001) plane, thereby forming voids on the pattern.

4. A method of producing a group III–V compound semiconductor in claim 1, comprising a process for forming a layer of the second group III–V compound semiconductor, the process includes: a first step of growing the layer of the second group III–V compound semiconductor through the openings of the pattern until surface portion thereof parallel to the surface of the layer of the first group III–V compound semiconductor disappears; a second step of continuing the growth of the layer of the second group III–V compound semiconductor so as to have slanted facets only; and a third step of continuing the growth of the layer with changing the growth condition so as to allow the layer of the second group III–V compound semiconductor to have surfaces parallel to the surface of the layer of the first group III–V compound semiconductor, thereby forming voids on the pattern.

5. A method of producing a group III–V compound semiconductor in claim 1, comprising a process for forming a layer of a second group III–V compound semiconductor, the process includes: a first step of growing the layer of the second group III–V compound semiconductor through the openings of the pattern until a surface portion thereof parallel to the surface of the layer of the first group III–V compound semiconductor disappears; a second step of continuing the growth of the layer of the second group III–V compound semiconductor so as to have slanted facets only; and a third step of continuing the growth of the layer with changing the growth condition so as to allow the layer of the second group III–V compound semiconductor to have surfaces of (0001) plane and facets perpendicular to the (0001) plane, thereby forming voids on the pattern.

6. A group III–V compound semiconductor obtained by performing at least once a process including forming a pattern and re-growing a group III–V compound semiconductor on a layer of the group III–V compound semiconductor of claim 1.

7. The method of producing a group III–V compound semiconductor according to claim 2 or 4, wherein the surface of the second group III–V compound semiconductor parallel to the surface of the layer of the first group III–V compound semiconductor is a (0001) plane.

* * * * *